(12) United States Patent
Franca-Neto

(10) Patent No.: US 6,466,775 B1
(45) Date of Patent: Oct. 15, 2002

(54) RADIO-FREQUENCY MIXER FOR WIRELESS APPLICATIONS

(75) Inventor: Luiz M. Franca-Neto, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/467,342

(22) Filed: Dec. 20, 1999

(51) Int. Cl.[7] ............................................... H04B 7/26
(52) U.S. Cl. ........................................ 455/326; 455/333
(58) Field of Search ................................ 455/333, 326, 455/313, 323, 189.1; 327/113, 116

(56) References Cited

U.S. PATENT DOCUMENTS

| | | | | |
|---|---|---|---|---|
| 4,727,597 A | * | 2/1988 | Dautriche | 455/252.1 |
| 5,341,111 A | * | 8/1994 | Miya et al. | 331/117 D |
| 5,517,688 A | * | 5/1996 | Fajen et al. | 327/113 |
| 5,602,504 A | * | 2/1997 | Liu | 327/100 |
| 5,999,804 A | * | 12/1999 | Forgues | 327/113 |
| 6,343,211 B1 | * | 1/2002 | Thodesen et al. | 455/305 |

* cited by examiner

Primary Examiner—Nguyen Vo
Assistant Examiner—Tu Nguyen
(74) Attorney, Agent, or Firm—Schwegman, Lundberg, Woessner & Kluth, P.A.

(57) ABSTRACT

A highly linear and low voltage mixer is shown. The mixer comprises a first transistor, a second transistor and a third transistor. The first transistor has a gate, source, and drain. The source is connected to the voltage supply and the gate and the drain are connected to an output node. The second transistor has a gate, source, and drain and the drain is connected to the output node, the source is connected to the ground node, and the gate receives a positive phase of the first signal and a positive phase of the second signal. The third transistor has a gate, source, and drain. The drain is connected to the output node, the source is connected to the ground node, and the gate receives a negative phase of the first signal and a negative phase of the second signal. The second and third transistors are turned on and off by the second signal.

18 Claims, 3 Drawing Sheets

RADIO-FREQUENCY MIXER FOR WIRELESS APPLICATIONS

FIELD OF THE INVENTION

This invention relates generally to radio-frequency mixers, and more particularly to low voltage, highly linear, double balanced radio-frequency mixers for wireless applications.

BACKGROUND OF THE INVENTION

Wireless devices are widely used. Wireless devices eliminate a cable or wire that would otherwise be needed. Wireless devices provide great benefits to users such as portability and ease of use. Wireless devices, such devices as cellular phones, radios, television, and cordless phones, are widely used and provide great benefits to users such as portability and ease of use. In addition, wireless devices eliminate a physical communication line, such as a cable or wire, that would otherwise be needed to carry the communicated data.

Many wireless devices utilize radio frequencies (RF) or infra red to transmit and receive data via wireless communication. A device transmits information by using radio frequencies and another device or devices receive that information by detecting and using RF. The transmitting device can also be a receiver. The transmitting device, among other operations, shifts the information signal from baseband frequencies to RF frequencies where it will experience more efficient transmission through the antenna. The receiving device, among other operations, shifts the RF signal from the antenna to lower frequencies, where demodulation and detection take place. The receiving device can then utilize the signal for a desired purpose. The signal can include digital data, analog data, voice, audio, video or anything else that can be in a signal.

The component used to shift signals from lower to higher frequencies or from higher to lower frequencies is called a mixer. A mixer multiplies its signal inputs often producing very complex products in the process. From an input spectrum containing perhaps hundreds of competing signals at a receiver's antenna, only one of these frequency products should be passed as an output signal. The output signal may go through other filters after the mixer. This one wanted signal may thereafter be amplified, usually by a variable amount of gain. The RF signal can be a transmitted or a received signal. The LO signal is generated locally and selects a certain channel. The channel is certain range of frequencies over which data or information can be transmitted and is used to access the appropriate or desired signal. On the transmitting end, the mixer combines a signal with a carrier wave to produce an outgoing RF signal. The carrier wave is at a frequency in a desired channel. On the receiving end, the mixer combines an incoming RF signal with a LO signal to produce the desired signal.

Furthermore, noise can be introduced into an electronic device by each component added. Every transistor adds some noise to a signal passing through it. The noise affects are cumulative. Thus, noise can be reduced by reducing the number of transistors used in a mixer. Reducing the number of transistors or components used also increases reliability by having less components that can fail.

For the reasons stated above, and for other reasons stated below which will become apparent to those skilled in the art upon reading and understanding the present specification, there is a need in the art for a highly linear, low voltage mixer in wireless applications.

SUMMARY

One embodiment of the invention is a mixer having at least one path from a voltage supply to a ground node wherein each path of the at least one path includes no more than two transistors. The mixer comprises a first transistor, a second transistor and a third transistor. The first transistor has a gate, source, and drain. The source is connected to the voltage supply and the gate and the drain are connected to an output node. The second transistor has a gate, source, and drain and the drain is connected to the output node, the source is connected to the ground node, and the gate receives a positive phase of the first signal and a positive phase of the second signal. The third transistor has a gate, source, and drain. The drain is connected to the output node, the source is connected to the ground node, and the gate receives a negative phase of the first signal and a negative phase of the second signal.

Other embodiments of systems and methods are disclosed.

DETAILED DESCRIPTION

The following discussion sets forth numerous specific details to provide a thorough understanding of the invention. however, those of ordinary skill in the art, having benefit of this disclosure, will appreciate that the invention may be practiced without these specific details. In addition, various well known methods, procedures, components, and circuits have not been described in detail in order to focus attention on the features of the present invention.

In wireless communications with RF signals, a mixer allows selecting of channels. Highly linear mixers allow better selecting of individual channels by receivers and permit more channels to be used in communications. High linearity avoids distortion of the information signal and precludes the generation of harmonics that may end up being received by another receiver operating at a different channel.

Figure 1A:
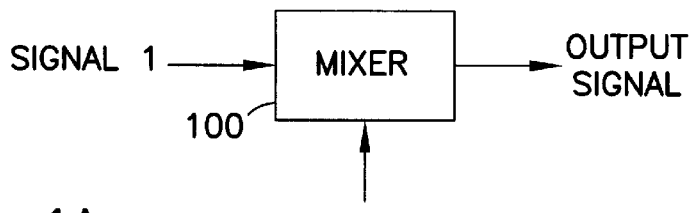
FIG. 1A is a conceptualized description of a mixer.

FIG. 1A is a conceptual description of a mixer. The mixer 100 has inputs signal 1 and signal 2 and an output. Signal 1 operates at a first frequency (f1). Signal 2 operates at a second frequency (f2). The mixer provides an output signal at frequencies f1−f2 and f1+f2. One of the frequencies of the output signal is typically filtered out so that the output signal has only one frequency, f1−f2 or f1+f2. This filtering can be done by a number of filters but the filtering is not usually done as part of the mixer.

Figure 1B:
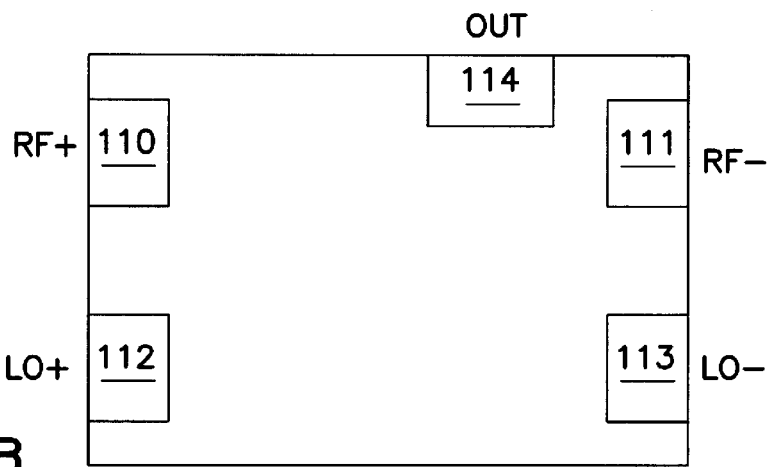
FIG. 1B is a block diagram of a mixer in accordance with an embodiment of the present invention.

FIG. 1B shows a mixer according to one embodiment of the invention. The mixer operates at a low voltage and is highly linear. For simplicity, only the mixer used in the receiver side is described. The transmitter can include a similar mixer but with its signals renamed.

The mixer includes a first input unit 110, a second input unit 111, a third input unit 112, a fourth input unit 113 and an output unit 114. The first input unit 110 receives a positive phase of a first signal. The first input unit 110 can be a node or a line. A "node" can simply be a connection between components. The first signal is a radio frequency signal. The second input 111 receives a negative phase of the first signal. The second input 111 can be a node or a line. The third input unit 112 receives a positive phase of a second signal. The third input unit 112 can be a node or a line. The second signal is a local oscillator (LO) signal that is generated locally. The fourth input unit 113 receives a negative phase of the second signal. The fourth input unit 113 can be a node or a line. By connecting positive and negative phases of both signals, the mixer is a double balanced mixer. By being double balanced, neither the RF signal nor the LO signal per se appear at the output, but only their products.

The output unit 114 can be a line or a node and outputs an output signal. The output signal is a product of the first and second signal. In one embodiment, the output is centered at a frequency equal to the frequency of signal 2 minus the frequency of signal 1.

Figure 1C:
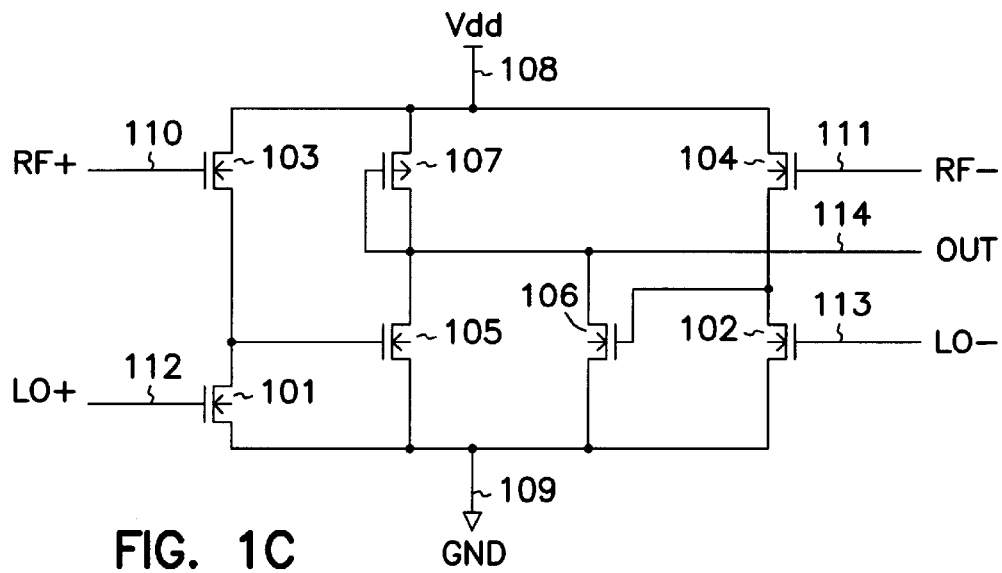
FIG. 1C is a diagram of a mixer in accordance with an embodiment of the present invention.

FIG. 1C shows a mixer according to one embodiment of the invention. The mixer includes a first input 110, a second input unit 111, a third input unit 112, a fourth input unit 113, an output unit 114, a voltage supply node 108, a ground node 109, a first transistor 101, a second transistor 102, a third transistor 103, a fourth transistor 104, a fifth transistor 105, a sixth transistor 106, and a seventh transistor 107.

The first input unit 110 receives a positive phase of a first signal. The first input unit 110 can be a node or a line. The first signal is a radio frequency signal. The second input 111 receives a negative phase of the first signal. The second input 111 can be a node or a line. The third input unit 112 receives a positive phase of a second signal. The third input unit 112 can be a node or a line. The second signal is a local oscillator (LO) signal that is generated locally. The fourth input unit 113 is receives a negative phase of the second signal. The fourth input unit 113 can be a node or a line. By connecting positive and negative phases of both signals, the mixer is a double balanced mixer. By being double balanced, one of or both of the amplitude levels of signals 1 and 2 can be changed without the output changing.

The first transistor 101 is typically a nmos transistor. The first transistor 101 has a gate, source and drain. The gate is connected to the third input unit 112. The source is connected to the ground node 109. Generally, the first transistor provides an interface with the positive phase of the second signal. The technology and the size of the first transistor 101 can vary with regard to the mixer's application. Generally, higher frequency operations require faster transistors.

The second transistor 102 is generally a rnos transistor. The second transistor 102 has a gate, source and drain. The gate is connected to the fourth input 113. The source is connected to the ground node 109. The ground node is not required to be at ground, but is at a voltage level lower than the voltage supply node 108. The second transistor 102 provides an interface with the negative phase of the second signal. Again, the technology and size of the second transistor 102 may vary depending on the application. The first transistor 101 and the second transistor 102, together, provide a double balanced connection to the second signal that prevents the second signal from propagating to the output signal. Only the product of the first signal and second signal are to appear at the output. However, mismatches, cmos devices, non linearity and paths can make other undefined signals be present at the output.

The third transistor 103 is generally a nmos transistor. The third transistor 103 has a gate, source and drain. The gate is connected to the first input unit 110 which is connected to the positive phase of the first signal. The drain is connected to the voltage supply node 108. The source is connected to the drain of the first transistor 101. Again, the technology and size of the third transistor 103 may vary depending on the application.

The fourth transistor 104 is generally a nmos transistor. The fourth transistor 104 has a gate, drain and source. The gate is connected to the second input unit 111 which is connected to the negative phase of the first signal. The drain is connected to the voltage supply node 108. The source is connected to the drain of the second transistor 102. Again, the technology and size of the fourth transistor 104 may vary depending on the implementation. The fourth transistor 104 and the third transistor 103, together, provide a balanced connection to the first signal that prevent the first signal from propagating to the output signal.

The fifth transistor 105 is generally a nmos transistor. The fifth transistor has a gate, drain and source. The gate is connected to the drain of the first transistor 101. The drain is connected to the output unit 114. The source is connected to the ground node 109. The technology and size of the fifth transistor 105 may vary depending on the application.

The sixth transistor 106 is generally a nmos transistor. The sixth transistor has a gate, drain and source. The gate is connected to the drain of the second transistor 102. The drain is connected to the output unit 114. The source is connected to the ground node 109. Again, the technology and size of the sixth transistor 106 may vary depending on the application. The fifth and sixth transistors (105 and 106) convert voltages at their gates to currents by a nonlinear finction. The fifth and sixth transistors (105 and 106) individually will conduct varying amounts of current, however their sum will be constant.

The seventh transistor 107 is generally a pmos transistor. The seventh transistor has a gate, source and drain. The gate is connected to the output unit 114. The source is connected to the voltage supply node 108. The drain is also connected to the output unit 114. Again, the technology and size of the seventh transistor 107 may vary depending on the application. The fifth transistor 105, the sixth transistor 106, and the seventh transistor 107 are referred to as the core of the mixer. The seventh transistor (107) converts the current conducted by the fifth and sixth (105 and 106) transistors back to a voltage signal at the output node.

The second signal generally has a higher amplitude than the first signal. Thus, the second signal causes the fifth and sixth transistors to alternatingly turn on and off. When the fifth transistor 105 is on, the sixth transistor 106 is off and when the sixth transistor is on, the fifth transistor is off. This allows the proper phase of the first signal to go to the output node.

Highly linear operation of the mixer is obtained by selecting the fifth, sixth, and seventh transistors such that the transconductance of the seventh transistor is substantially equal to the sum of the transconductance of the sixth and fifth transistors. This permits the seventh transistor to compensate for non-linearity in the current produced by the fifth and sixth transistors (105 and 106). Generally, this requires that the pmos transistor 107 be sized around 2.5 times wider than the nios transistors (105 and 106) since in modem cmos technology, pmos and nmos transistors present transconductance of 133 mS/mm and 350 mS/mnm respectively.

Besides yielding a highly linear mixer, this topology provides a highly linear mixer at low voltages. This mixer can operate at low voltages, such as one volt or even lower, because the maximum number of transistors from the voltage supply to ground for any path from the voltage supply to ground is two transistors. Additionally, in an alternate embodiment, the nmos transistors can be replaced with pmos transistors and the pmos transistors can be replaced with nmos transistors along while providing similar functionality.

Figure 1D:
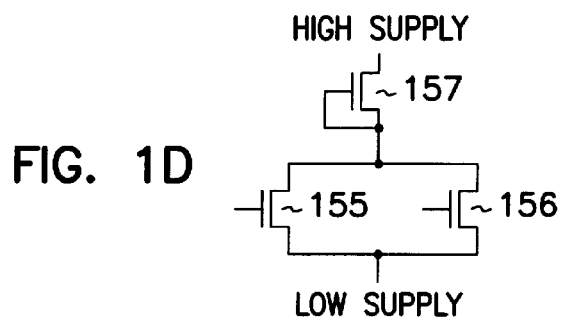
FIG. 1D is a diagram of a mixer core in accordance with an embodiment of the present invention.

FIG. 1D is one embodiment of a core of a mixer and includes transistors 157, 155 and 156. Transistor 157 is a pmos transistor having a gate, source, and drain. The gate and drain of transistor 157 are connected and provide an output. Transistor 155 is a nmos transistor having a gate, source and drain. The drain of transistor 155 is connected to the gate and drain of transistor 157. Transistor 156 is a nmos transistor having a gate, source and drain. The drain of transistor 156 is connected to the drain of transistor 155 and the gate and drain of transistor 157. The gate of transistor 155 receives a negative phase of a local oscillator signal and a negative phase of a RF signal. The gate of transistor 156 receives a positive phase of the RF signal and a positive phase of the local oscillator signal. The source of transistor 157 is coupled to a high supply level. The high supply level can be a voltage. The source of transistor 155 and the source of transistor 156 are coupled to a low supply. The low supply is at a lower voltage level than the high supply. The low supply may, for example, be ground.

The local oscillator signal typically has a bigger amplitude signal compared to the RF signal. The local oscillator signal will alternately turn "on" and "off" the transistors 155 and 156. While transistor 155 is on, transistor 156 is off and while transistor 156 is on, transistor 155 is off. Because of this action caused by the local oscillator signal, the RF signal will be alternately processed by transistors 157 and 155 and transistors 157 and 156. While transistor 155 is on, the positive phase of the RF signal is output. While transistor 156 is on, the negative phase of the RF signal is output. Other components or transistors may be used to provide the RF and local oscillator signals, and their phases, to the core such as the transistors of FIG. 1C.

Figure 2A:
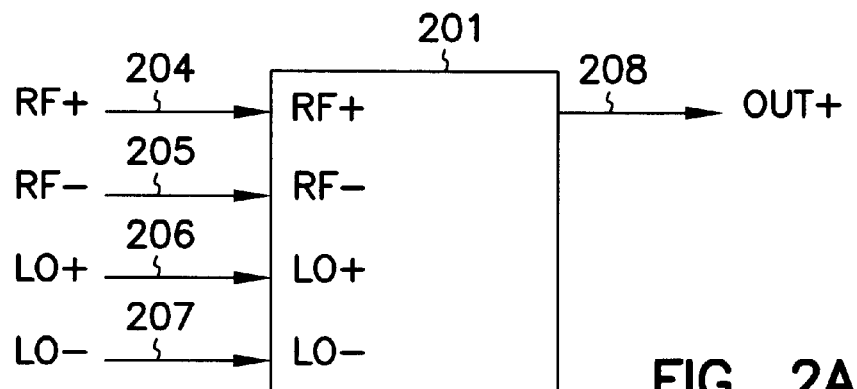
FIG. 2A is a block diagram of a mixer in accordance with an embodiment of the invention.

FIG. 2A shows a mixer according to one embodiment of the invention. The mixer 201 provides a positive phase of an output signal. The mixer 202 provides a negative phase of an output signal. The mixer 201 includes a first input 204, a second input 205, a third input 206, a fourth input 207, and an output unit 208. The first input 204 receives a positive phase of a RF signal. The second input 205 receives a negative phase of a RF signal. The third input 206 receives a positive phase of a LO signal. The fourth input 207 receives a negative phase of a LO signal. The output unit 208 provides the positive phase of the output signal that is a product of the RF and LO signals. The mixer 201 is a highly linear and low voltage mixer that can have the topology described in FIG. 1B.

Figure 2B:
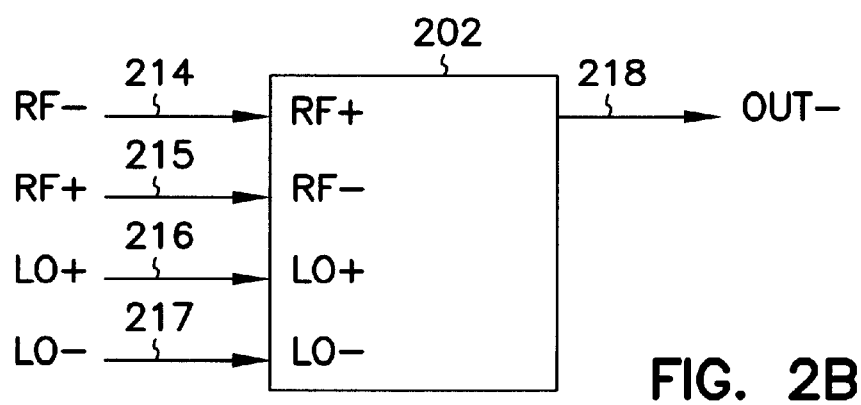
FIG. 2B is a block diagram of a mixer in accordance with an embodiment of the invention.

FIG. 2B shows a mixer according to one embodiment of the invention. The mixer 202 provides a negative phase of an output signal and can be used in conjunction with mixer 201 of FIG. 2A. The mixer 202 includes a first input 214, a second input 215, a third input 216, a fourth input 207, and an output unit 218. The mixer 202 is a duplicate of the mixer 201 except that the two RF inputs are reversed. The first input 214 receives a negative phase of the RF signal. The second input 215 receives the positive phase of the RF signal. The third input 216 receives the positive phase of the LO signal. The fourth input 217 receives the negative phase of the LO signal. The output unit 218 provides the negative phase of the output signal that is a product of the RF and LO signals.

Figure 2C:
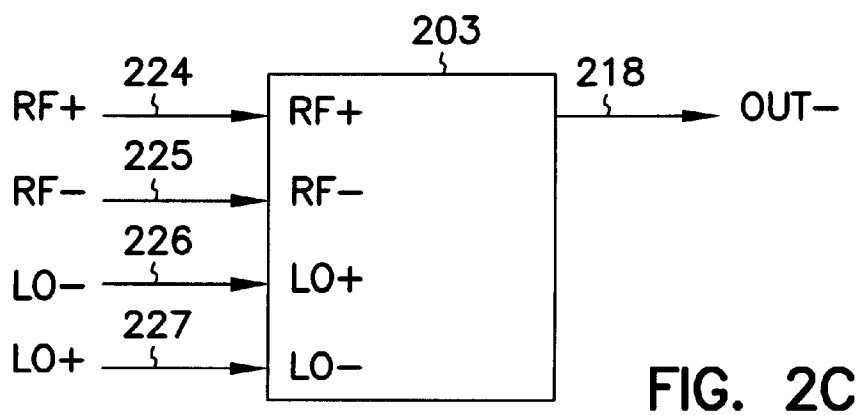
FIG. 2C is a block diagram of a mixer in accordance with an embodiment of the invention.

FIG. 2C shows a mixer according to one embodiment of the invention. The mixer 203 provides a negative phase of an output signal and can be used in conjunction with mixer 201 of FIG. 2A. Mixer 203 is a duplicate of the mixer 201 except that the two LO inputs are reversed. Mixer 203 includes a first input 224, a second input 225, a third input 226, a fourth input 227 and an output unit 228. The first input 224 receives the positive phase of the RF signal. The second input 225 receives the negative phase of the RF signal. The third input 226 receives the negative phase of the LO signal. The fourth input 227 receives the positive phase of the LO signal. The output unit 218 provides the negative phase of the output signal that is a product of the RF and LO signals.

Figure 3:
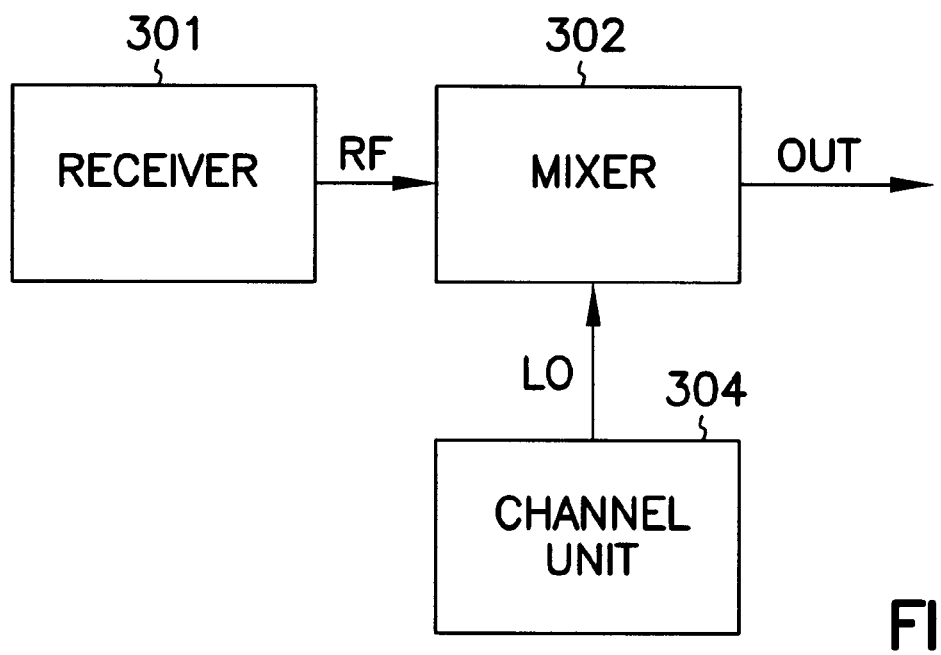
FIG. 3 is a block diagram of a receiving system in accordance with an embodiment of the invention.

FIG. 3 shows a receiving system according to an embodiment of the invention. The receiving system includes a receiver 301, a mixer 302 and a channel unit 304. The receiver 301 receives an RF signal and passes the RF signal to the mixer. The RF signal may have varying amplitudes depending on the distance from transmitters and the power of the transmitters. The channel unit 304 generates a LO signal corresponding to a desired channel. The LO signal may be constant such as being set to generate a particular channel or the LO signal may be selectable corresponding to a user selecting a channel. The LO signal is passed to the mixer 302. The mixer 302 is a double balanced, highly linear, and low voltage mixer according to an embodiment of the invention. The mixer generates an output signal that is a product of the RF and LO signals. The mixer 302 can be a differential mixer and produce the output signal as the multiplication of the LO by the RF signal. For example, if the LO signal is 3 gigahertz tone and the RF signal is 2.5 gigahertz tone then the resulting output signal will have 500 kilohertz tone, plus a 5.5 gigahertz tone. The higher frequency tone, 5.5 gigahertz tone, can be filtered out. The output signal of lower frequency can be utilized by electronic devices.

Figure 4:
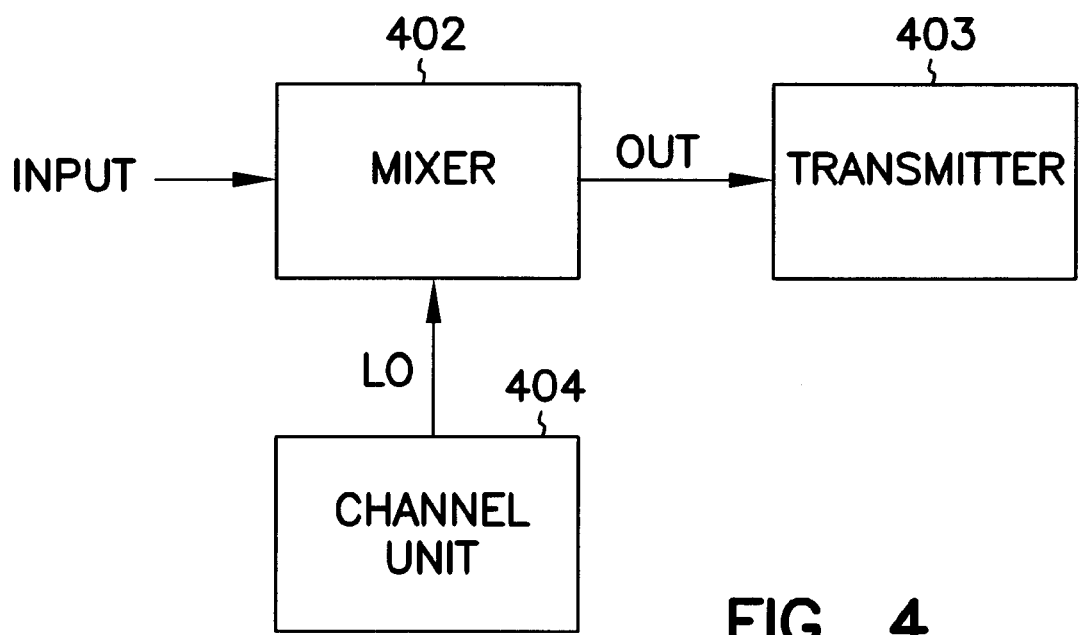
FIG. 4 is a block diagram of a transmitting system in accordance with an embodiment of the invention.

FIG. 4 shows a transmitting system according to an embodiment of the invention. The transmitting system includes a mixer 402, a transmitter 403, and a channel unit 404. An input signal is received by mixer 402. The channel unit 404 generates a carrier wave according to a corresponding channel. The channel can be set or selected by a user. The carrier wave signal is passed to the mixer 402. The mixer 402 is a highly linear and low voltage mixer. The mixer 402 produces a transmit signal that is a product of the carrier wave and the output signal. The transmit signal is passed from the mixer 402 to the transmitter 403. The transmitter 403 transmits the transmit signal so that it may be received by other receiving systems. The transmit signal can be received by other receiving systems alone or in combination with other signals making up the RF signal.

FIGS. 3 and 4, together, provide for a wireless communication system that operates with definitive channels. This permits safer and clearer transmission. Further, this enhances privacy of communication. This communication system can be used for such systems as wireless local area networks (Wireless LAN) that permit computers to communicate among themselves without cables or a physical connection.

The invention has been described with reference to specific embodiments. Persons skilled in the art and having the benefit of this disclosure will recognize that these embodiments may be modified in a variety of ways, without deviating from the spirit of the invention. For example, while some of the disclosed embodiments refer to computers, the invention is applicable to other devices such as wireless intercoms. The specific examples are provided only to more clearly illustrate various features of the invention which is limited solely by the scope of the appended claims.

What is claimed is:

1. A mixer having at least one path from a voltage supply to a ground node wherein each path of the at least one path includes no more than two transistors comprising:
   a first transistor having a gate, source, and drain wherein the source is connected to the voltage supply and the gate is connected to the drain are connected to an output node; and
   a second transistor having a gate, source, and drain wherein the drain is connected to the output node, the source is connected to the ground node, and the gate of the second transistor receives a positive phase of a first signal and a positive phase of a second signal;
   a third transistor having a gate, source, and drain wherein the drain is connected to the output node, the source is connected to the ground node, and the gate receives a negative phase of the first signal and a negative phase of the second signal.

2. The mixer of claim 1, wherein the second and third transistors are turned on and off by the second signal.

3. The mixer of claim 2, wherein the transconductance of the first transistor is substantially equal to the transconductance of the second transistor and the third transistor for providing high linearity.

4. The mixer of claim 2, wherein the transconductance of the first transistor is made different than the transconductance of the second and third transistors in order to increase gain of the mixer.

5. The mixer of claim 2, wherein the first transistor is a pmos transistor, the second transistor is a nmos transistor, and the third transistor is a nmos transistor.

6. The mixer of claim 5, wherein the first signal is a received radio frequency signal and the second signal is a local oscillator signal.

7. The mixer of claim 5, wherein the first signal is a received infra red frequency signal and the second signal is a local oscillator signal.

8. The mixer of claim 7, wherein the second signal is selectable by a user.

9. A mixer having at least one path from a voltage supply to a ground node wherein each path of the at least one path includes no more than two transistors and wherein the mixer comprises:
   a first transistor having a gate, source, and drain wherein the drain is connected to the voltage supply and the gate and source are connected to an output node; and
   a second transistor having a gate, source, and drain wherein the source is connected to the output node, the drain is connected to the ground node, and the gate is connected to a positive phase of a first signal and a positive phase of a second signal;
   a third transistor having a gate, source, and drain wherein the source is connected to the output node, the drain is connected to the ground node, and the gate is connected to a negative phase of the first signal and a negative phase of the second signal; and
   wherein the first transistor is a pmos transistor, the second transistor is a nmos transistor and the third transistor is a nmos transistor.

10. A mixer having at least one path from a voltage supply to a ground node wherein each path of the at least one path includes no more than two transistors and wherein the mixer comprises:
    a first transistor having a gate, source, and drain wherein the source is connected to the ground node and the gate and drain are connected to an output node; and
    a second transistor having a gate, source, and drain wherein the drain is connected to the output node, the source is connected to the voltage supply, and the gate is connected to a positive phase of a first signal and a positive phase of a second signal;
    a third transistor having a gate, source, and drain wherein the drain is connected to the output node, the source is connected to the voltage supply, and the gate is connected to a negative phase of the first signal and a negative phase of the second signal; and
    wherein the first transistor is a nmos transistor, the second transistor is a pmos transistor and the third transistor is a pmos transistor.

11. A differential mixer pair for providing a positive and negative phase of an output signal comprising:
    a first mixer having at least one path from a voltage supply to a ground node wherein each path of the at least one path includes no more than two transistors and wherein a path of the at least one path comprises:
       a first transistor having a gate, source, and drain wherein the source is connected to the voltage supply and the gate and drain are connected to an output node;
       a second transistor having a gate, source, and drain wherein the drain is connected to the output node, the source is connected to the ground node, and the gate receives a positive phase of a first signal and a positive phase of a second signal;
       a third transistor having a gate, source, and drain wherein the drain is connected to the output node, the source is connected to the ground node, and the gate receives a negative phase of the first signal and a negative phase of the second signal; and
       wherein the output node provides the positive phase of the output signal; and
    a second mixer having at least one path from a voltage supply to a ground node wherein each path of the at least one path includes no more than two transistors and wherein a path of the at least one path comprises:
       a first transistor having a gate, source, and drain wherein the source is connected to the voltage supply and the gate and drain are connected to an output node;
       a second transistor having a gate, source, and drain wherein the drain is connected to the output node, the source is connected to the ground node, and the gate receives the negative phase of the first signal and the positive phase of the second signal;
       a third transistor having a gate, source, and drain wherein the drain is connected to the output node, the source is connected to the ground node, and the gate receives the positive phase of the first signal and the negative phase of the second signal; and
       wherein the output node provides the negative phase of the output signal.

12. A mixer comprising:
a first input unit to receive a positive phase of a first signal;
a second input unit to receive a negative phase of the first signal;
a third input unit to receive a positive phase of a second signal;
a fourth input unit to receive a negative phase of the second signal;
a output unit for providing an output signal;
a voltage supply node having a voltage;
a ground node connected to ground;
a first transistor having a gate, source and drain wherein the gate is connected to the third input unit and the source is connected to the ground node;
a second transistor having a gate, source and drain wherein the gate is connected to the fourth input unit and the source is connected to the ground node;
a third transistor having a gate, source and drain wherein the gate is connected to the first input unit, the drain is connected to the voltage supply node and the source is connected to the drain of the first transistor;
a fourth transistor having a gate, source and drain wherein the gate is connected to the second input unit, the drain is connected to the voltage supply node, and the source is connected to the drain of the second transistor;
a fifth transistor having a gate, source and drain wherein the gate is connected to the drain of the first transistor, the drain is connected to the output unit and the source is connected to the ground node;
a sixth transistor having a gate, source and drain wherein the gate is connected to the drain of the second transistor, the drain is connected to the output unit and the source is connected to the ground node; and
a seventh transistor having a gate, source and drain wherein the gate is connected to the output unit, the source is connected to the voltage supply node and the drain is connected to the output unit.

13. The mixer of claim 12 wherein the first, second, third, fourth, fifth and sixth transistors are nmos transistors and the seventh transistor is a pmos transistor.

14. The mixer of 13, wherein the first, second, third, fourth, fifth and sixth transistors are pmos transistors, the seventh transistor is a nmos transistor and the voltage supply is replaced by the ground node and the ground node is replaced by the voltage supply.

15. The mixer of claim 12, wherein a transconductance of the fifth and sixth transistors is equal to a transconductance of the seventh transistor.

16. The mixer of claim 12, wherein the output signal includes a product of the first and the second signals and some high frequency harmonics.

17. The mixer of claim 12, wherein the second signal is selected to produce a desired signal as the output signal.

18. A mixer comprising:
a first input unit to receive a positive phase of a first signal;
a second input unit to receive a negative phase of the first signal;
a third input unit to receive a positive phase of a second signal;
a fourth input unit to receive a negative phase of the second signal;
a output unit for providing an output signal;
a voltage supply node having a voltage;
a ground node connected to ground;
a first transistor having a gate, source and drain wherein the gate is connected to the third input unit and the drain is connected to the ground node;
a second transistor having a gate, source and drain wherein the gate is connected to the fourth input unit and the drain is connected to the ground node;
a third transistor having a gate, source and drain wherein the gate is connected to the first input unit, the source is connected to the voltage supply node and the drain is connected to the drain of the first transistor;
a fourth transistor having a gate, source and drain wherein the gate is connected to the second input unit, the source is connected to the voltage supply node, and the drain is connected to the drain of the second transistor;
a fifth transistor having a gate, source and drain wherein the gate is connected to the source of the first transistor, the source is connected to the output unit and the drain is connected to the ground node;
a sixth transistor having a gate, source and drain wherein the gate is connected to the source of the second transistor, the source is connected to the output unit and the drain is connected to the ground node;
a seventh transistor having a gate, source and drain wherein the gate is connected to the output unit, the drain is connected to the voltage supply node and the source is connected to the output unit; and
wherein the first, second, third, fourth, fifth and sixth transistors are pmos transistors and the seventh transistor is a nmos transistor.

* * * * *